United States Patent [19]

Sevenhans et al.

[11] Patent Number: 5,283,535
[45] Date of Patent: Feb. 1, 1994

[54] DIFFERENTIAL AMPLIFIER ARRANGEMENT

[75] Inventors: Joannes M. J. Sevenhans, Brasschaat; Mark G. S. J. Van Paemel, Zoersel, both of Belgium

[73] Assignee: Alcatel N.V., Amsterdam, Netherlands

[21] Appl. No.: 937,313

[22] Filed: Sep. 1, 1992

[30] Foreign Application Priority Data

Sep. 25, 1991 [EP] European Pat. Off. ......... 91202503.8

[51] Int. Cl.$^5$ .............................................. H03F 3/45
[52] U.S. Cl. ..................................... 330/253; 330/258
[58] Field of Search ............... 330/252, 253, 254, 257, 330/258, 259, 261

[56] References Cited

U.S. PATENT DOCUMENTS

| | | | |
|---|---|---|---|
| 4,272,728 | 6/1981 | Wittlinger | 330/253 |
| 5,028,881 | 7/1991 | Jackson | 330/253 |
| 5,187,448 | 2/1993 | Brooks et al. | 330/253 X |

FOREIGN PATENT DOCUMENTS 0344855 12/1989 European Pat. Off. .
2136652 9/1984 United Kingdom .

*Primary Examiner*—Steven Mottola
*Attorney, Agent, or Firm*—Spencer, Frank & Schneider

[57] ABSTRACT

An arrangement includes a differential amplifier pair configured as first and second amplifier branches with first and second input terminals respectively. The first and second amplifier branches are connected at a junction point to a common branch which includes a current source. A control circuit regulates the current of the current source to linearize an input/output characteristic of the amplifier differential pair. The control circuit includes a negative feedback circuit having a comparator, a first input of the comparator being connected to a reference voltage terminal to which an external reference voltage is applied, a second input of the comparator being connected to the amplifier branch junction point and an output of the comparator connected for controlling the current source.

10 Claims, 1 Drawing Sheet

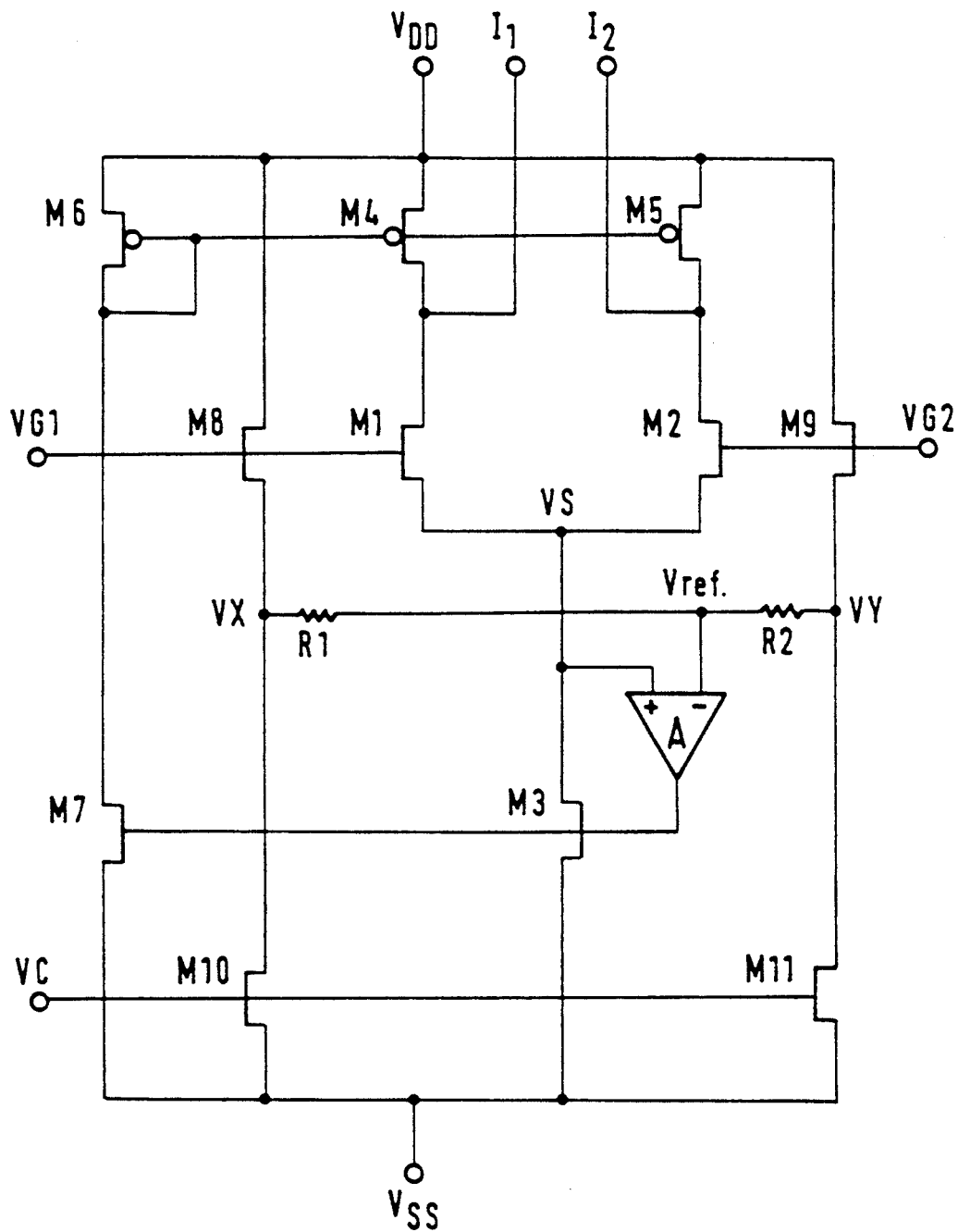

DIFFERENTIAL AMPLIFIER ARRANGEMENT

BACKGROUND OF THE INVENTION

1. Field of the Invention

The present invention relates to a differential amplifier arrangement including a differential pair having comprising two individual amplifier branches with first and second input terminals and connected at a junction point to a common branch which includes a current source, the current of the current source being regulated by a control circuit so as to linearize an input/output characteristic of the differential pair.

2. Background Information

Such a differential amplifier arrangement is already known in the art, e.g. from the book "Analogue IC design: the current-mode approach", edited by C. Tomazou et al, IEEE circuits and systems series 2, 1990, pages 197–202, and more particularly FIG. 5.12 thereof. In this known arrangement a control circuit is used to linearize the input voltage/output current characteristic of the differential pair. This linearization is obtained by keeping the gain or the transconductance (gm) of the amplifier independent of the differential input voltage across the input terminals. To this end the control circuit includes an auxiliary differential pair of NMOS transistors which are controlled by the first and the second input terminals, and in which drain currents are applied in common via a mirror circuit to the gate electrode of a third NMOS transistor included in the common branch and constituting a regulated current source. The source electrodes of the NMOS transistors of the auxiliary differential pair are connected to a common voltage terminal to which a constant DC voltage source needs to be connected.

A problem with this known arrangement is that the control circuit is a feed forward circuit which puts stringent demands on the matching of all the MOS transistors of the arrangement in order to achieve the required linearity. In more detail, the MOS transistors of the individual amplifier branches and these of the auxiliary differential pair have to match perfectly, as well as the PMOS transistors of the mirror circuit and the NMOS transistor of the mirror circuit with the third NMOS transistor. This leads to manufacturing constraints which are difficult to achieve.

SUMMARY OF THE INVENTION

An object of the present invention is to provide a differential amplifier arrangement of the above known type, but wherein the linearization of the input/output characteristic is achieved, matching only a minimum number of active devices of the arrangement.

According to the invention, this object is achieved due to the fact that the control circuit includes a negative feedback circuit with a comparator whose inputs are connected to a reference terminal to which a reference voltage is applied and to the junction point, and whose output controls the current source.

In this way, only the active devices of the individual amplifier branches have to match for obtaining the required linearity, the negative feedback compensating possible mismatches between other devices of the arrangement.

Furthermore, when the voltage at the junction point deviates from the reference voltage, the negative feedback circuit modifies the current of the current source so as to align the voltage at the junction point to the reference voltage.

Another drawback of the control circuit of the known arrangement is that it requires the use of a constant DC voltage source, i.e. with a low impedance. Indeed, it can be proved that the above linearization is obtained as a result of the so-called "square law" of the MOS transistors. This law expresses the current flowing through a MOS transistor as a function of the square of the voltage difference between the gate and source electrodes of this MOS transistor. If the above voltage source is not perfect, its impedance will affect the current in the MOS transistors and the linearization cannot be achieved.

Another object of the present invention is to obtain the requested linear characteristic in a simple way without requiring an ideal voltage source, such a source not easily realized in practice.

According to the invention, this other object is achieved due to the fact that the comparator is an operational amplifier having a non-inverting and an inverting input, the junction point and the reference terminal being connected to the non-inverting and inverting inputs respectively.

Since both the junction point and the reference terminal are connected to the inputs of an operational amplifier which has a high input impedance, no ideal voltage source needs to be provided for achieving the above linearization.

Until now it has been implicitly considered that the differential amplifier arrangement only receives perfectly symmetrical input signals across the differential first and second input terminals. This is however not always the case in practice and the linearization can then only be obtained by keeping the transconductance (gm) independent of the common mode voltage across the input terminals.

A further object of the present invention is to provide a differential amplifier arrangement of the above known type but which linearizes the input/output characteristic even when unsymmetrical differential input signals are applied to the input terminals.

Also according to the invention this further object is achieved due to the fact that the reference terminal is so coupled to the input terminals that the reference voltage follows the common mode voltage on the input terminals.

In this way, the common mode voltage at the input terminals is compensated by the voltage at the junction point, this voltage being supplied by the control circuit.

In more detail, the control circuit further includes a first and a second interface means and a voltage divider, and that the reference terminal is a tap point of the voltage divider whose input terminals are coupled through the first and second interface means to the first and second input terminals, respectively.

By this circuit, the transconductance remains independent of the common mode voltage.

Still another object of the present invention is to obtain an adjustable gain or transconductance (gm) of the differential amplifier arrangement. By modifying the transconductance the slope of the above characteristic will also be modified.

This other object is achieved due to the fact that the control circuit further includes means to derive the reference voltage as a sum of the common mode voltage and a predetermined voltage.

As can be proved mathematically, the transconductance (gm) is modified by modifying the voltage at the junction point. Because the latter voltage follows the reference voltage the control circuit associated with this reference voltage allows not only the linearization of the above characteristic but also the modification of the slope thereof.

This is achieved due to the fact that the first and second interface means are respectively connected in series with a second and third current sources, the output terminals of the voltage divider being connected to the junction points of the first interface means and the second current source and of the second interface means and the third current source, respectively, the current in the second and third current sources being regulated via a control input terminal through which the predetermined voltage is adjusted.

By modifying the signal at the control input terminal, the current in both the second and third current sources is modified. This leads to a variation of the voltage across the interface means, i.e. between the first/second input terminal and the input terminals of the voltage divider. As a result, the reference voltage, and thus also the voltage at the junction point, are modified. This voltage change at the junction point does not harm the above linearity since it is independent of the differential input voltage across the first and second input terminals.

When a common mode input voltage appears on the amplifier branches, the latter voltage is compensated by the control circuit as mentioned above. However, this compensation leads to the generation of a common mode current in the individual amplifier branches and this common mode output current may cause problems to the following circuits.

Also another object of the present invention is to suppress the common mode output current in the individual amplifier branches.

Also according to the invention, this other object is achieved due to the fact that the differential amplifier arrangement further includes current mirror circuitry controlled by the control circuit and of which the outputs are coupled to the individual amplifier branches for suppressing common mode output currents therein.

In more detail, the current mirror circuitry includes a fourth current source connected in series with a current mirror and a fifth and a sixth current sources connected in series with distinct ones of the individual amplifier branches and controlled by the current mirror.

The control circuit together with the current mirror circuitry eliminate the common mode output current in the following way. When a common mode input signal is applied to the differential amplifier, the control circuit modifies the reference voltage and thereby the voltage at the junction point by controlling the current of the first current source. As a result, a common mode output current is generated in the individual amplifier branches. However, according to the invention, this current is counterbalanced by a replica thereof which is generated by the current mirror circuitry under the control of the control circuit and which is also flowing through the individual amplifier branches but in the reverse direction.

BRIEF DESCRIPTION OF THE DRAWING

The above mentioned and other objects and features of the invention will become more apparent and the invention itself will be best understood by referring to the following description of an embodiment taken in conjunction with the accompanying drawing which shows an operational transconductance amplifier OTA according to the invention.

DETAILED DESCRIPTION OF THE PREFERRED EMBODIMENTS

The operational transconductance amplifier OTA shown is used as a basic building block in active analogue integrated filters where it is generally used in combination with a capacitance (not shown). It is then known as an OTA-C pair producing one pole, the location of the latter being linearly dependent on the overall transconductance gm of the amplifier. Hence, by modifying gm, the location of the pole can be changed and the OTA-C pair can be tuned to have a particular frequency response.

More particularly, the operational transconductance amplifier (OTA) is a differential input voltage to a differential output current transducer with an adjustable overall transconductance gm. OTA has differential voltage input terminal VG1 and VG2 and differential current output terminals I1 and I2. It mainly includes, coupled between power supply terminals VDD and VSS at which, e.g., 5 Volts and 0 Volt are respectively supplied, a differential pair of two individual amplifier branches each constituted by the drain-to-source path of a NMOS transistor M1/M2 and connected in common at a junction point VS to the drain electrode of another NMOS transistor M3 of which the source electrode is connected to VSS. The input terminals VG1, VG2 are connected to the source electrodes of M1,M2 and the drain electrodes of the latter transistors are connected to the output terminals I1,I2 respectively. Additionally to this classical differential amplifier structure, OTA includes between the terminals VDD and VSS, two branches which are each constituted by the series connection of the drain-to-source paths of NMOS transistors M8/M9 and M10/M11, respectively. The junction point VX of M8 and M10 is coupled to the junction point VY of M9 and M11 via a voltage divider constituted by the series connection of two identical resistors R1 and R2. The tapping point Vref of this voltage divider is connected to the inverting input (−) of a differential amplifier A, the non-inverting input (+) of which is connected to the junction point VS and the output of which is connected to the gate electrode of the NMOS transistor M3. The input terminals VG1,VG2 are connected to the gate electrodes of the NMOS transistors M8,M9 respectively, while a control input terminal VC is connected to the gate electrodes of both the NMOS transistors M10 and M11.

Voltages VG1, VG2, VS, VX, VY and Vref and currents I1 and I2 are present at the like-named terminals.

A first goal of the above described control circuit is to linearize the differential input voltage (VG2−VG1) versus differential output current (I2−I1) characteristic of the differential amplifier OTA. This linearization allows the differential amplifier to handle large signals, e.g. of 2.5 Volts peak-to-peak, without distortion. To this end, and as will be explained below, the overall transconductance gm of the differential amplifier is kept constant by maintaining the common voltage VS at the like-named junction point equal to the reference voltage Vref. This is realized by the operational amplifier A acting as a comparator for the two latter voltages and controlling the gate electrode of transistor M3 operating as a regulated current source able to modify the common voltage VS.

In more detail, the above linearization is based on the so-called "square law" of a differential amplifier and which can be expressed as:

$$Id = k(VG - VS - VT)^2 \quad (1)$$

where Id is the drain current, VG the gate voltage, VT the threshold voltage and k a conductance parameter dependent on processing parameters such as $\mu$ and Cox of the MOS transistor of an amplifier branch, VS being the above common voltage.

Starting from this relation (1) and assuming that the NMOS transistors M1 and M2 are matched, the above mentioned transfer characteristic of the amplifier can be written as:

$$I2 - I1 = 2k \cdot (VG2 - VG1) \cdot \left( \frac{VG1 + VG2}{2} - VS - VT \right) \quad (2)$$

where second order effects such as mobility reduction of the electrons and body effect have been neglected.

The overall transconductance gm of the operational amplifier can thus be written as:

$$gm = 2k \cdot \left( \frac{VG1 + VG2}{2} - VS - VT \right) \quad (3)$$

From these relations it can be seen that the non-linearity of the above characteristic is caused by the common input voltage (VG1+VG2)/2 as well as by the dependence of VS on the differential mode input voltage (VG2−VG1).

If the differential input signals applied to the input terminals VG1 and VG2 are perfectly symmetrical, no common mode input voltage is present and it would be sufficient to keep the common voltage VS constant to obtain the above linearity. Because this common voltage VS is equal to the reference voltage Vref, it would then be enough to supply a constant DC voltage to the reference voltage terminal Vref. Moreover, the voltage source supplying this reference voltage need not have a low impedance because of the high input impedance of the operational amplifier A.

Unfortunately in practice, a common mode input voltage is very often present and needs to be counterbalanced to ensure a constant value for the transconductance gm. This is realized by controlling the common voltage VS to follow the common mode input voltage (VG1+VG2)/2.

In more detail, the common mode input voltage is transmitted from VG1, VG2 to the terminals VX, VY via the gate-to-source path of the source-follower transistors M8/M9 acting then as interface means. This common mode input voltage then appears at the voltage terminal Vref and thus also at the junction point VS owing to the comparator A and the regulated current source M3.

From the above it follows that the linearization of the differential input voltage versus differential output current characteristic of the differential amplifier arrangement is obtained by keeping the overall transconductance gm independent of both the differential voltage (VG2−VG1) and the common mode voltage (VG1+VG2)/2.

Since the present operational transconductance amplifier OTA is used in filters, it is also important to be able to change the overall transconductance gm in order to tune the filter to a predetermined frequency response. This is a second goal of the control circuit described above.

Because the common voltage VS is equal to the reference voltage Vref, the above relation 3 may be written as:

$$gm = 2k \cdot \left( \frac{VG1 + VG2}{2} - Vref - VT \right) \quad (4)$$

From this relation (4) it appears that the transconductance gm can be modified by modifying the reference voltage Vref, and without affecting the above linearity.

Therefore, apart from the fact that the reference voltage Vref follows the common mode input voltage (VG1+VG2)/2 as explained above, another voltage, e.g. a DC voltage, may be added (or substracted) to Vref for obtaining a predetermined transconductance gm. This additional voltage is supplied to Vref as derived from a control voltage VC applied to the like-named control input terminal. The latter control voltage VC controls the currents flowing through both the NMOS transistors or current sources M10 and M11 whereby the voltages VX and VY are modified. As a result, the reference voltage Vref is also modified as a function of VC and the value of gm changes accordingly.

It is to be noted that a modification of the transconductance gm leads to a modification of the slope of the above mentioned linear characteristic.

The already described, operational transconductance amplifier OTA further includes a common mode output current rejection circuit which is controlled by the comparator A so as to adjust common mode currents in the individual amplifier branches including the NMOS transistors M1 and M2.

This circuit includes, between the voltage supply terminals VDD and VSS, the series connection of a diode connected PMOS transistor M6 with the drain-to-source path of NMOS transistor M7, the output of the operational amplifier A being connected to the gate electrode of M7. Furthermore, a PMOS transistor M4/M5 is inserted between the voltage supply terminal VDD and the drain electrode of the NMOS transistor M1/M2 of each of the individual amplifier branches, the gate and source electrodes of M6 being connected in common to the gate electrodes of both the transistors M4 and M5.

The purpose of this last circuit is to remove the common mode output current from the differential output currents I1 and I2 taken at the drain electrodes of M1 and M2 respectively. This unwanted common mode output current is generated by the controlling action of the above negative feed back loop of the control circuit. Indeed, any change of the common mode input voltage would lead, as explained above, to a change of the reference voltage Vref and thus also to a change of the common voltage VS at the like named junction point. As a consequence, the modification of VS leads to the generation of a common mode current in the two amplifier branches and this current will appear in the output current causing damage to the following circuits.

The present circuit generates a replica from the common mode current and this replica is injected into the two amplifier branches to counterbalance the unwanted common mode current.

To this end, the current source M7 is controlled by the output of the comparator A—which also control the current source M3 for modifying the common voltage VS—and the current generated by M7 is mirrored via M6 to the current sources M4 and M5 which in turn generate the replica of the unwanted common mode output current. This latter current is thereby removed from the differential output currents I1 and I2.

It is to be noted that the present amplifier OTA is entirely integrated in an electronic chip and is able to handle signals over a large frequency range extending from audio to a few MHz.

While the principles of the invention have been described above in connection with specific apparatus, it is to be clearly understood that this description is made only by way of example and not as a limitation on the scope of the invention.

We claim:

1. A differential amplifier arrangement comprising:
   a differential amplifier pair configured as first and second amplifier branches with first and second input terminals respectively, said amplifier branches including first and second input transistors respectively, the first and second amplifier branches being connected at a junction point to a common branch which includes a current source connected to said first and second input transistors; and
   a control circuit for regulating the current of said current source to linearize an input/output characteristic of said differential amplifier pair;
   wherein said control circuit comprises a negative feedback circuit including a comparator, a first input of the comparator being connected to a reference voltage terminal to which an external reference voltage is applied, a second input of the comparator being connected to said junction point, and an output of said comparator connected for controlling said current source;
   wherein said comparator is an operational amplifier, said second terminal of said comparator being a non-inverting input of said operational amplifier and said first terminal of said comparator being an inverting input of said operational amplifier, said junction point and said reference voltage terminal being connected to said non-inverting and inverting inputs respectively.

2. A differential amplifier arrangement comprising:
   a differential amplifier pair configured as first and second amplifier branches with first and second input terminals respectively, said amplifier branches including first and second input transistors respectively, the first and second amplifier branches being connected at a junction point to a common branch which includes a current source connected to said first and second input transistors; and
   a control circuit for regulating the current of said current source to linearize an input/output characteristic of said differential amplifier pair;
   wherein said control circuit comprises a negative feedback circuit including a comparator, a first input of the comparator being connected to a reference voltage terminal to which an external reference voltage is applied, a second input of the comparator being connected to said junction point, and an output of said comparator connected for controlling said current source; and
   wherein said reference voltage terminal is coupled to said input terminals whereby said reference voltage follows a common mode voltage on said input terminals.

3. A differential amplifier arrangement according to claim 2, wherein said control circuit further comprises:
   a voltage divider having a tap point corresponding to said reference voltage terminal; and
   first and second interface means for coupling respective first and second voltage divider inputs to said first and second input terminals of said first and second amplifier branches, respectively.

4. A differential amplifier arrangement according to claim 2, wherein said control circuit further comprises means for producing said reference voltage as a sum of said common mode voltage and a predetermined voltage.

5. A differential amplifier arrangement according to claim 3, wherein:
   said first and second interface means are respectively connected in series at respective junction points with second and third current sources;
   said voltage divider input terminals are connected to respective junction points of said first interface means and said second current source and said second interface means and said third current source, respectively; and
   current in said second and third current sources is regulated through a control input terminal for adjusting said predetermined voltage.

6. A differential amplifier arrangement comprising:
   a differential amplifier pair configured as first and second amplifier branches with first and second input terminals respectively, said amplifier branches including first and second input transistors respectively, the first and second amplifier branches being connected at a junction point to a common branch which includes a current source connected to said first and second input transistors;
   a control circuit for regulating the current of said current source to linearize an input/output characteristic of said differential amplifier pair; and
   current mirror circuitry controlled by said control circuit and having outputs coupled to said first and second amplifier branches for suppressing common mode output currents therein;
   wherein said control circuit comprises a negative feedback circuit including a comparator, a first input of the comparator being connected to a reference voltage terminal to which an external reference voltage is applied, a second input of the comparator being connected to said junction point, and an output of said comparator connected for controlling said current source.

7. A differential amplifier arrangement according to claim 6, wherein said current mirror circuitry includes:
   a fourth current source connected in series with a current mirror; and
   fifth and sixth current sources connected in series with respective amplifier branches and controlled by said current mirror.

8. A differential amplifier arrangement according to claim 6, wherein said individual amplifier branches and said current sources each comprise at least one MOS transistor.

9. A differential amplifier arrangement according to claim 3, wherein said interface means each comprise at least one MOS transistor.

10. A differential amplifier arrangement according to claim 3, wherein said voltage divider comprises:
first and second substantially equal resistors connected in series, the point of connection of said resistors constituting said tap point.

* * * * *